United States Patent [19]

Bjornsen et al.

[11] 3,949,393

[45] Apr. 6, 1976

[54] ANALOG SWEEP CALIBRATOR

[75] Inventors: Gary L. Bjornsen, Marion; Kenneth R. Rutherford, Cedar Rapids, both of Iowa

[73] Assignee: Rockwell International Corporation, El Segundo, Calif.

[22] Filed: Aug. 16, 1974

[21] Appl. No.: 497,964

[52] U.S. Cl. ............ 340/347 CC; 307/228; 328/185
[51] Int. Cl.² ......................................... H03K 13/00
[58] Field of Search ............. 340/347 CC; 328/185; 307/228

[56] References Cited
UNITED STATES PATENTS

| | | | |
|---|---|---|---|
| 3,175,161 | 3/1965 | Hackborn et al. | 328/185 |
| 3,200,338 | 8/1965 | Ellis | 328/35 |
| 3,493,961 | 2/1970 | Hansen | 340/347 |
| 3,555,298 | 1/1971 | Neelands | 307/235 |
| 3,596,193 | 7/1971 | Dunwoodie | 328/185 |
| 3,750,142 | 7/1973 | Barnes et al. | 340/347 CC |

*Primary Examiner*—Charles D. Miller
*Attorney, Agent, or Firm*—Richard W. Anderson; Robert J. Crawford

[57] ABSTRACT

A method and means for employing digital means to calibrate an analog sweep waveform in a range determining system. The method imparts digital accuracy in maintaining the voltage-distance analog of the sweep waveform by generating a clock defined strobe at a time when the sweep voltage should reach a reference voltage level, comparing at strobe time the sweep voltage with a precision voltage source of reference level, and correcting the slope of the sweep voltage in accordance with any discrepancy existing at the time of comparison.

4 Claims, 4 Drawing Figures

ANALOG SWEEP CALIBRATOR

This invention relates generally to means for attaining an analog sweep generator output waveform having a constantly defined slope and more particularly to a means for calibrating the output of an analog sweep generator by digital means, such that the analog sweep output enjoys digital accuracy.

Numerous timing and ranging systems employ an analog sweep waveform for measurement purposes. For example, in distance measuring equipments (DME), an analog sweep waveform is initiated at the time of each transmitted interrogation pulse, and the analog value of the sweep waveform at the time of a reply pulse is utilized to determine a readout of distance between the airborne interrogator and the ground transponder. Such systems depend upon the linearity and defined slope of the sweep waveform for accuracy in measurement. The sweep waveform represents an analog in the form of volts/miles upon which this distance measurement is ultimately made.

Analog circuitries oftimes enjoy advantages which may be more economical than accurate. For example, a typical integrator arrangement whereby a sweep waveform is generated may include a voltage source, analog switching means, and various resistors. Any change in value of these circuit components will cause a corresponding change in the integrator slew rate or output slope. Thus, problems are encountered when these components, due to environmental service conditions and/or aging, change from their nominal design values. A change in the slew rate or slope of the analog sweep waveform results in inaccurate range determinations.

Accordingly, it is an object of the present invention to provide a digital calibrator for an analog sweep generator whereby the analog sweep output waveform is caused to be of constant and predetermined slope by being corrected for deviations from nominal by digital means whereby the analog waveform enjoys digital accuracy.

A further object of the present invention is to provide a digital calibration means for an analog sweep generator circuitry whereby the slope of the output waveform is held at a predetermined constant.

The present invention is featured in the provision of generating, by digital means under the control of a digital clock source, a time measurement which corresponds to the analog value to which a sweep waveform would rise if its designed slope were correctly maintained and to compare the attained sweep voltage level at this instant in time with a precision voltage source whose level corresponds to the desired analog level. Any discrepancy between the analog sweep level and the reference level occurring at this time is utilized to correct the sweep waveform voltage-time analog.

These and other features and objects of the present invention will become apparent upon reading the following description with reference to the accompanying drawings in which.

Figure 1:
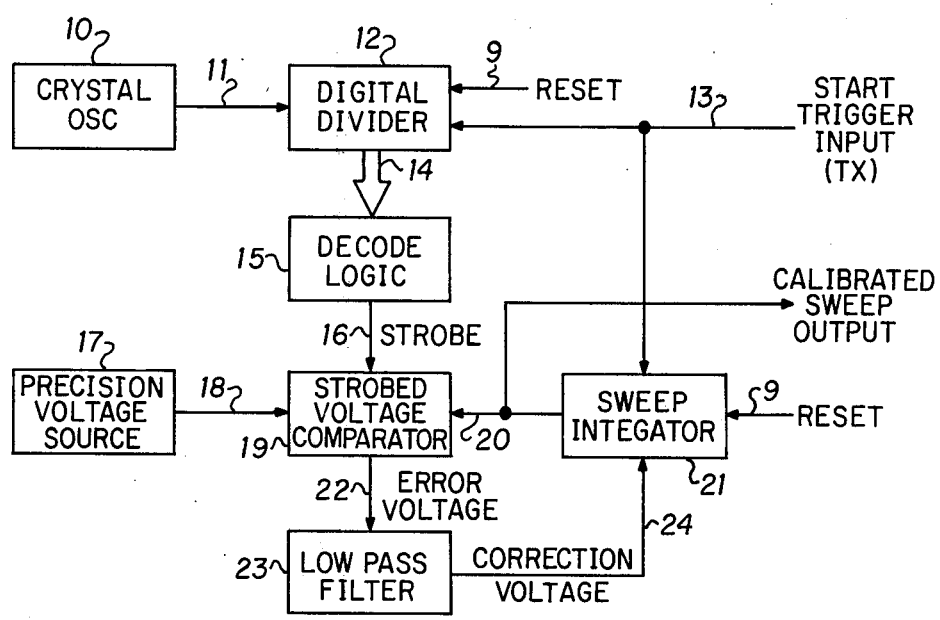
FIG. 1 is a functional block diagram of an analog sweep calibrator system in accordance with the present invention.

The present invention will be described in the environment of maintaining an extremely accurate sweep voltage analog in a distance measuring equipment system. The invention is obviously equally useful for maintaining the voltage-time analog of any sweep voltage generating system wherein it is desired that a precise analog be maintained.

In a DME system, an analog sweep waveform is commonly employed whereby the analog defined by the sweep is representative of measured distance. A sweep generator or integrator is employed to measure distance and provide a means for generating a voltage-time analog with magnitude proportional to distance. The integrator is started when the distance measuring equipment interrogates a ground station, and the output of the integrator slews at a predetermined rate (slope). If the integrator slews at the correct rate, the distance measurement will be correct. For example, it may be desired to maintain a precisely accurate sweep analog of 40 millivolts per nautical mile. In such a system, if the integrator slews too fast or too slow, the distance determination subsequently made will be in error by an amount proportional to the distance being measured and the slew rate of the integrator. For example, if in the instance of a design analog of 40 millivolts per nautical mile, the slew rate of the integrator was actually 41 millivolts per nautical mile, and the range being measured was 100 nautical miles, the error in the subsequent range determination would be 1 $mv/nm \times 100nm \div 40mv/nm = 2.5nm$. Thus, it is extremely important to keep the integrator slew rate at exactly the design value of 40 millivolts per nautical mile to maintain accurate and valid distance determination.

The slew rate (slope) of the sweep integrator in an analog system is determined by an integrator and a current source for the integrator. The current source may include a voltage source, analog switch, and various resistors, and thus changes by aging or environmental conditions imparted to the circuit components, cause corresponding changes in the slew rate and corresponding errors in distance determination.

Thus, the present invention provides a digital means for calibrating and maintaining an exact design slew rate in an analog sweep generator output waveform such that the analog output provided by the sweep generator means enjoys digital accuracy. In general, an extremely accurate digital time measurement is employed. This time measurement, when considered with the design analog as concerns the sweep waveform, corresponds to the time at which the sweep waveform should be at a design voltage level. A precision voltage source at this level is employed and, at this digitally determined time, the existing output level of the analog sweep generator is compared with the precision voltage source. Any discrepancy between these levels is utilized to develop a correction signal to alter the slope of the analog sweep generator in a closed loop arrangement whereby the designed voltage/mile analog of the sweep generator is precisely maintained.

With reference to FIG. 1, a sweep integrator 21, as it might be embodied in a DME system, generates, in response to input trigger pulses 13 (which in a DME system correspond to successive interrogation transmissions), a sweep output waveform 20 which is utilized to subsequently make a determination of distance, based on the analog value of the sweep output 20 occurring at the time of reception of a reply pulse.

In accordance with the present invention, the sweep output 20 is maintained at a precise analog slew rate in accordance with digitally controlled calibration circuitry. A crystal oscillator 10 provides accurate clock pulses 11 which are applied to a digital divider 12. The digital divider (along with sweep integrator 21) is enabled, in response to successive start trigger pulses 13, to count the clock pulses 11.

The binary count in digital divider 12 is outputted on Line 14 to a decode logic circuitry 15 to develop a strobe pulse 16 upon a predetermined count being reached in digital divider 12. Strobe 16 is applied as an enabling input to a strobed voltage comparator 19 which receives a precision voltage source input 18 from source 17 and the output of the sweep integrator 20 as respective inputs thereto. The strobed voltage comparator develops an error voltage output 22 corresponding to the discrepancy between the precision voltage source input 18 level and the level of the sweep integrator at the time of strobe 16. a low-pass filter 23 receives the error voltage 22 and develops a correction voltage 24 which is applied to the sweep integrator to control the charging rate thereof. Means, such as a reset pulse on line 9 are inputed to reset the divider 12 and sweep integrator 21 at the conclusion of successive interrogation cycles initiated by trigger input 13. The reset pulses might correspond to the sweep output 20 rising to a predetermined level.

Operation of the calibration circuitry depicted in FIG. 1 might best be comprehended from consideration of a specific example. Let it be assumed that a design slew-rate of sweep integrator 21 of 40 millivolts per nautical mile is desired. Since round-trip travel time for L-band DME radio waves is 12.359 microseconds per nautical mile, the desired output analog voltage of 40 millivolts per mile determines that the sweep integrator must slew at a rate of 40 millivolts per 12.359 microseconds. Thus, at a particular range, for example 200 nautical miles, the sweep output waveform 20 should be at a voltage level of 8.00 volts (40 millivolts per nautical mile times 200 nautical miles equals 8.00 volts). This voltage level is attained 3,471.8 microseconds (12.359 microseconds per nautical mile times 200 nautical miles equals 3,471.8 microseconds) after the sweep generator and divider 12 were started. The sweep calibrator will be shown to control the integrator in such a manner as to keep a 40 millivolts per nautical mile slew rate.

Sweep integrator 21 and the digital divider 12 are started at the same time by the time occurrence of start trigger input pulses 13. At a fixed time later (3,471.8 microseconds of 200 nautical miles) a decode count is accumulated in the divider 12. The decode count causes decode logic circuitry to generate a strobe pulse 16 at this time. Strobe pulse 16 is applied to a strobed voltage comparator 19 which compares the output 20 of the sweep integrator 21 with stable reference voltage 18 at the instant 200 nautical miles worth of time has elapsed. At this instant, the output of the integrator 21 should be exactly 8.000 volts. The precision voltage source 17 provides a reference 8.000 volts. The output 22 of the voltage comparator, as will be further described, is a voltage whose polarity is determined by whether the output 20 of integrator 21 is less than or more than the reference voltage input 18 at the time of the strobe pulse 16. This error voltage 22 is filtered by a lowpass filter 23 to remove the AC component and applied to the sweep integrator 21 as a correction voltage (current) to either increase or decrease the slew rate of the sweep integrator 21 so that its output passes through 8.000 volts at 3,471.8 microseconds (200 nautical miles). Thus, the output of the sweep integrator 21 is calibrated to slew at exactly 40 millivolts per nautical mile.

Figure 2:
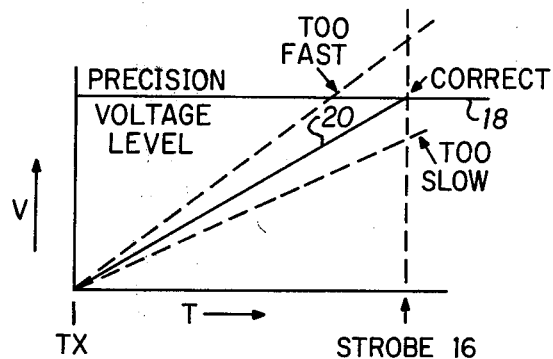
FIG. 2 is a diagrammatic representation of the corrective principle as concerns the slope of the analog waveform.

FIG. 2 illustrates the desired analog sweep output 20 which rises to the precision voltage level 18 at the time of strobe pulse 16. Sweep waveform 20 is shown to rise from 0 volts at the time of a trigger pulse 13-($T_x$) at a desired slope such that its level reaches equals the precision voltage level 18 at the time of the digitally determined strobe pulse 16. Also illustrated are sweep waveforms which are either too fast or too slow and their levels at the time of a strobe pulse 16 are respectively greater than and less than that of the precision voltage level at the time of the strobe pulse.

Figure 3:
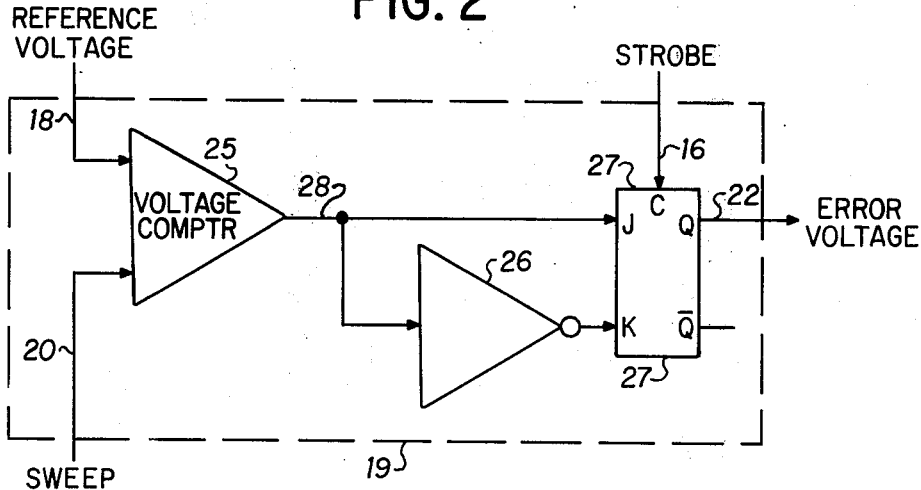
FIG. 3 is a functional diagram of a type of strobed voltage comparator useful in the system of FIG. 1.

FIG. 3 illustrates a particular implementation of a strobed voltage comparator 19 useful in the circuitry of FIG. 1. The strobed voltage comparator 19 as illustrated in FIG. 3 might be comprised of an operational amplifier voltage comparator 25 receiving the reference voltage source 18 and sweep generator output 20 as respective inputs thereto. The operational amplifier is operated in open loop fashion such that the output 28 therefrom is at one binary level when the sweep generator waveform is in excess of the reference voltage 18 and of a different binary level when the sweep voltage waveform is less than the referenced voltage level. The output 24 from the voltage comparator 25 is supplied to the J input of a J-K flip-flop 27 and through an inverter 26 to the K input of J-K flip-flop 27. The strobe pulse 16 from the decode logic block 15 of FIG. 1 is applied to the clock (C) input of the J-K flip-flop. The Q output 22 from the flip-flop 27 comprises the error voltage output 22 which is applied to the low-pass filter 23 of FIG. 1. The J-K flip-flop, 27, in response to a binary 1 J input and binary 0 K input, drives the Q output to a binary 1 at the time occurrence of a clock or strobe pulse 16. The flip-flop, in response to a J input of binary 0 and K input of binary 1, drives the Q output to a binary 0 at the time occurrence of a clock or strobe pulse 16. For the purpose of this invention the binary 1 and binary 0 outputs of the J-K flip-flop 27 might be defined as +12 volts and −12 volts, respectively. It may then be seen that if the Q output 22 of the J-K flip-flop 27 is caused to be a symmetrical waveform, the average value of this waveform as it is applied through the lowpass filter of FIG. 1 becomes zero and the resultant error correction voltage 24 applied to the sweep integrator 21 is zero. If, on the other hand, the output of J-K flip-flop were caused to be held in one of its two possible binary states, this level would pass through the lowpass filter 23 and provide a corresponding correction voltage 24 of one polarity or the other. Further analysis of the operation of the strobe voltage comparator with reference to the waveforms of FIG. 4 will illustrate these operational characteristics of the strobe voltage comparator and how they are effective in developing control voltages to realize the objectives of the invention.

Figure 4:
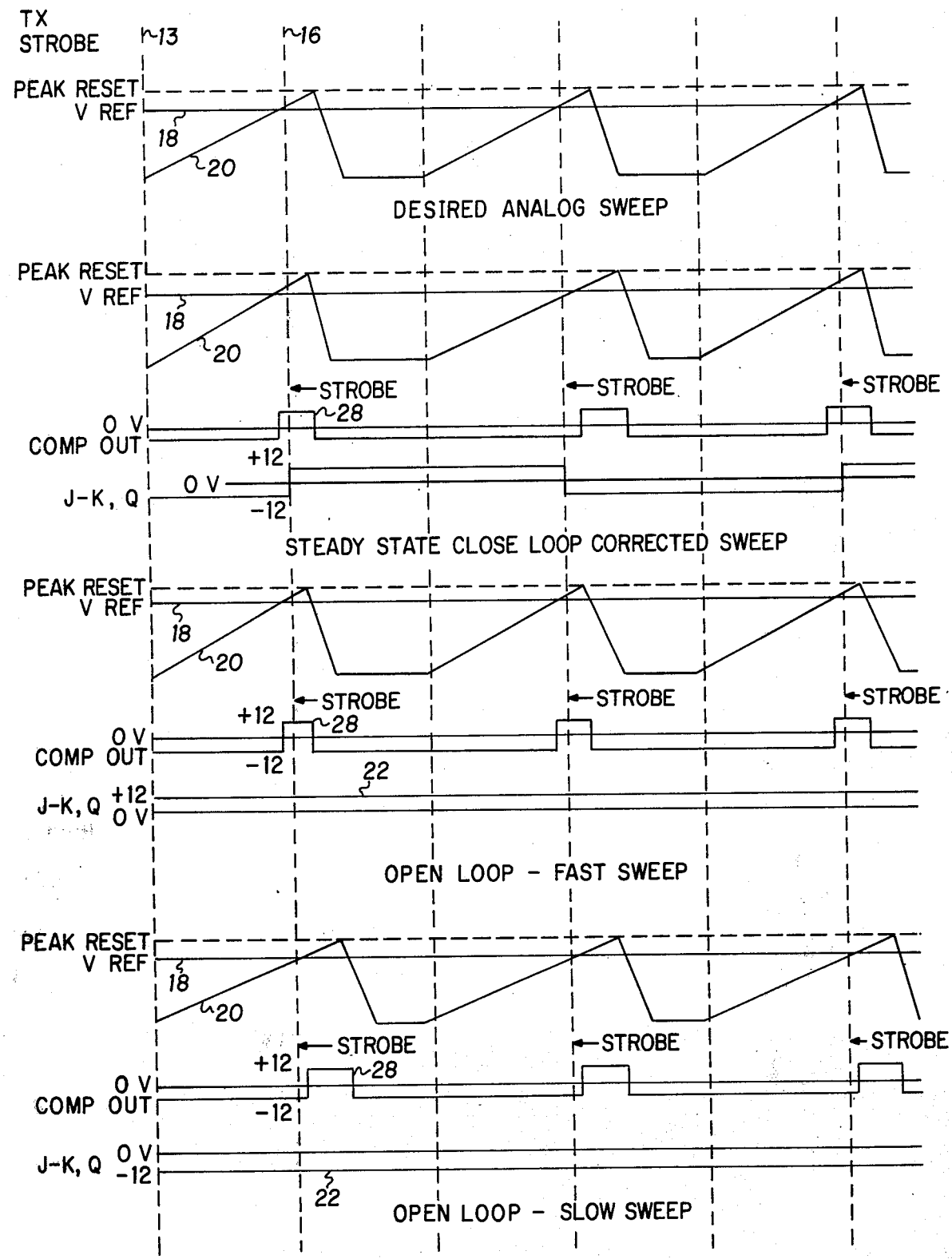
FIG. 4 shows operational waveforms related to the srobed voltage comparator of FIG. 3.

With reference to FIG. 4, trigger pulses 13 are depicted along with sweep waveforms which they initiate. Strobe pulses 16 are indicated at a point in time on each successive sweep corresponding to, for example, the above exampled 200 miles analog point. This point is less than the maximum sweep voltage analog. The sweep is reset to zero when it rises to a peak reset level and prior to the occurrence of a subsequent trigger pulse 13.

FIG. 4 illustrates operational waveforms under three conditions. The condition of a steady state corrected sweep where the sweep amplitude equals the reference voltage 18 at the time of the strobe pulse 16 is depicted along with conditions of a too-fast sweep and a too-slow sweep.

Considering first the condition of a too-fast sweep (where the sweep waveform exceeds the reference at the time of a strobe pulse 16), voltage comparator 25 exhibits a binary 1 output 24 during that period of time when the sweep is in excess of the reference. Since the strobe pulse 16 occurs at the time of the binary 1 output 24 from the comparator, the J-K flip-flop maintains a binary 1 Q output 22 through successive sweep cycles. The binary 1 steady state output 22 from the J-K flip-flop 27 passes through the filter 23 of FIG. 1 and may provide appropriate sensing to cause the sweep slope to be reduced towards that slope where the sweep will rise to the magnitude of the reference voltage source 18 at the time of strobe 16.

Now, considering the situation when the sweep is too slow (the sweep magnitude is less than the voltage reference at strobe time), the comparator output 24 does not rise to binary 1 until after the time of a strobe pulse 16 and the J-K flip-flop Q output 22 remains at binary 0. If then, this binary 0 is defined as −12 volts, it is seen that an opposite corrective voltage is developed for application to filter 23 of FIG. 1, and a correction voltage 24 with opposite polarity may cause the sweep slope to be increased towards the correct value which will develop a sweep magnitude at strobe time equal to the reference.

Finally, the waveforms of FIG. 4 illustrate a steady state or corrected sweep situation wherein, essentially, the sweep rises to the value of the voltage reference at strobe time. The corrective principle as concerns the strobe voltage comparator under steady state conditions is based on successive slight over-corrections as concerns the slope of the sweep, such that the sweep alternatively (to a very slight degree) exceeds and is less than the voltage reference at the time of successive strobe pulses. This situation is depicted in exaggerated form in the waveforms of FIG. 4. Considering the first depicted sweep cycle, the waveforms assume that the sweep is slightly too high at strobe time, with the result that the comparator 25 produced a 1 output 24 the leading edge of which slightly leads the time appearance of strobe pulse 16. In response to this condition, the J-K flip-flop 27 provides a binary 1 Q output 22. Now, when considering a long term closedloop condition, the next cycle of the sweep illustrates a slight overcorrection where the value of the sweep is slightly less than that of the voltage reference 18 at the time of the strobe, with the resultant comparator output going to binary 1 after the time appearance of the strobe. This condition causes the J-K flip-flop 27 to produce a binary 0 Q output. Successive cycles of the sweep, under the corrected sweep steady state condition, indicate that due to slight overcorrection on alternate sweeps as concerns the slope of the sweep, the J-K flip-flop 27 is caused to produce an output 22 comprised of a symmetrical square wave alternating between binary 0 and binary 1 levels. With these levels defined as respective positive and negative DC voltages of the same magnitude, the average of this waveform, when passed through the lowpass filter 23 of FIG. 1, obviously becomes zero and the correction voltage tends towards zero. Thus, a toggling action of the Q output of the J-K flip-flop is experienced over a period of corrective closed loop control with the average value of this waveform tending toward zero and the sweep for all intents and purposes is caused to be maintained with a slope such that it rises to the value of the reference voltage source 18 at the time of the strobe. The required sweep analog is thus maintained with the enjoyment of digital accuracy in accordance with the present invention.

It is seen that the J-K flip-flop embodied in the strobed voltage comparator of the discussed embodiment of this invention generally functions to remember, from one sweep cycle to the next, when the sweep was high or low and to develop an output waveform the average value of which is appropriately sensed for correcting the slope of the sweep integrator 21 of FIG. 1 to that value which precisely maintains the sweep analog.

Although the present invention has been described with respect to a particular embodiment thereof, it is not to be so limited, as changes might be made therein which fall within the scope of the invention as defined in the appended claims.

We claim:

1. Means for calibrating a repetitive analog sweep voltage waveform to maintain a desired voltage-time analog, comprising a precision voltage source the magnitude of which corresponds to that defined by a desired sweep voltage-time analog at a predetermined time after initiation of said sweep voltage; digital clock controlled timing means generating a strobe pulse at a time after initiation of said sweep voltage corresponding to said predetermined time, said clock controlled timing means comprising a source of clock pulses, a binary counter, means responsive to successive initiations of said sweep voltage to enable said counter, and logic means responsive to a predetermined count in said counter equivalent to a time measurement equal that of said predetermined time to generate said strobe pulse; means for comparing the amplitude of said sweep voltage with said precision voltage source at the time occurrence of said strobe pulse; means responsive to a discrepancy in amplitude between said sweep voltage and said reference voltage source at the time of said strobe pulse to generate a correction signal, said means to generate said correction signal comprising a voltage comparator receiving said precision voltage source and said sweep voltage as respective inputs thereto, control voltage development means comprising a J-K flip-flop, receiving the output of said voltage comparator and said strobe pulses as respective inputs thereto, said development means generating oppositely sensed and like amplitude DC voltage output control signals in response to successive magnitudes of said sweep voltage respectively exceeding annd being less than the magnitude of said precision voltage source at the time occurrence of said strobe pulses and holding that voltage magnitude and sense at least until the time occurrence of a next succeeding one of said strobe pulses; signal averaging means receiving said DC output control signals, the output of said signal averaging means comprising said correction signal, and control means responsive to said correction signal to alter the slope of said sweep voltage to cause the sweep voltage to equal said precision voltage source at the time occurrence of said strobe pulses.

2. Means as defined in claim 1 wherein said control voltage development means comprises a means applying the output of said voltage comparator and the complement thereof as respective inputs to the J and K input terminals of said flip-flop, means applying said strobe pulses to the input of the clock input terminal of said flip-flop, said signal averaging means comprising low-pass filtering means receiving one of the Q and $\bar{Q}$ outputs of said flip-flop, and the output of said low-pass filtering means comprising said correction signal.

3. Means as defined in claim 2 wherein said lowpass filtering means has a long time constant compared to the repetition rate of said sweep voltage waveform.

4. Means as defined in claim 3 wherein the magnitude of said precision voltage source is substantially equal to and less than the maximum amplitude of said sweep waveform.

* * * * *